(12) United States Patent  
Nakatani et al.

(10) Patent No.: US 8,362,473 B2  
(45) Date of Patent: Jan. 29, 2013

(54) ORGANIC EL DEVICE AND METHOD FOR MANUFACTURING SAME

(75) Inventors: Shuhei Nakatani, Osaka (JP); Kenji Okumoto, Kyoto (JP); Kiyohiko Takagi, Osaka (JP)

(73) Assignee: Panasonic Corporation, Osaka (JP)

( * ) Notice: Subject to any disclaimer, the term of this patent is extended or adjusted under 35 U.S.C. 154(b) by 119 days.

(21) Appl. No.: 13/059,442

(22) PCT Filed: Sep. 1, 2009

(86) PCT No.: PCT/JP2009/004294  
§ 371 (c)(1),  
(2), (4) Date: Feb. 17, 2011

(87) PCT Pub. No.: WO2010/038356  
PCT Pub. Date: Apr. 8, 2010

(65) Prior Publication Data  
US 2011/0156079 A1    Jun. 30, 2011

(30) Foreign Application Priority Data  
Sep. 30, 2008    (JP) .................................. 2008-254524

(51) Int. Cl.  
H01L 29/08    (2006.01)  
(52) U.S. Cl. .................................. 257/40; 257/E51.022  
(58) Field of Classification Search .................. 257/40, 257/98, 642, 643, 759, E39.007, E51.001, 257/E51.022, E51.003, E51.013, E27.117, 257/E27.118, E27.119  
See application file for complete search history.

(56) References Cited

U.S. PATENT DOCUMENTS

| | | |
|---|---|---|
| 2002/0016031 A1 | 2/2002 | Fujimori et al. |
| 2003/0211643 A1 | 11/2003 | Fujimori et al. |
| 2005/0168140 A1 | 8/2005 | Nakamura et al. |
| 2005/0170208 A1 | 8/2005 | Yatsunami et al. |
| 2005/0287392 A1 | 12/2005 | Toyoda |
| 2006/0170338 A1 | 8/2006 | Masuichi et al. |
| 2006/0223221 A1 | 10/2006 | Ishii |
| 2007/0065180 A1 | 3/2007 | Yatsunami |
| 2007/0263164 A1* | 11/2007 | Kumagai ...................... 349/156 |
| 2007/0290604 A1 | 12/2007 | Sakanoue et al. |
| 2008/0231179 A1 | 9/2008 | Abe et al. |

FOREIGN PATENT DOCUMENTS

| | | |
|---|---|---|
| JP | 2002-237383 | 8/2002 |
| JP | 2003-332080 | 11/2003 |
| JP | 2004-055177 | 2/2004 |

(Continued)

OTHER PUBLICATIONS

International Search Report in PCT/JP2009/004294 dated Oct. 13, 2009.

*Primary Examiner* — Victor A Mandala  
*Assistant Examiner* — Selim Ahmed  
(74) *Attorney, Agent, or Firm* — Greenblum & Bernstein, P.L.C.

(57) ABSTRACT

A manufacturing method of an organic EL device, comprising: providing a substrate on which a pixel electrode is arranged, forming a liquid repellent organic film on the substrate and the pixel electrode, radiating a light selectively to an area of the pixel electrode to be coated with an organic functional layer, to oxidize a surface of the pixel electrode, and to change the liquid repellent organic film on the area to a lyophilic organic film or to remove the liquid repellent organic film on the area, applying an ink containing an organic functional material on the area defined by the liquid repellent organic film to form the organic functional layer on the pixel electrode.

9 Claims, 8 Drawing Sheets

FOREIGN PATENT DOCUMENTS

| | | |
|---|---|---|
| JP | 2004-171951 | 6/2004 |
| JP | 2005-158494 | 6/2005 |
| JP | 2005-268099 | 9/2005 |
| JP | 2005-310473 | 11/2005 |
| JP | 2006-86128 | 3/2006 |
| JP | 2006-188487 | 7/2006 |
| JP | 2006-278101 | 10/2006 |
| JP | 2006-294261 | 10/2006 |
| JP | 2007-005784 | 1/2007 |
| JP | 2007-288071 | 11/2007 |
| JP | 2007-324033 | 12/2007 |
| JP | 2008-078038 | 4/2008 |
| JP | 2008-270731 | 11/2008 |

* cited by examiner

ORGANIC EL DEVICE AND METHOD FOR MANUFACTURING SAME

TECHNICAL FIELD

This invention relates to an organic EL device and the manufacturing method thereof.

BACKGROUND ART

The organic EL device is a light-emitting device utilizing electroluminescence of an organic compound. That is to say, the organic EL device comprises a pixel electrode, an opposite electrode and an organic emitting layer with electroluminescence function arranged between both electrodes. The material of organic luminescent layer with electroluminescence is classified into an organic polymer materials and a combination of low-molecular organic compounds (host material and dopant material). Examples of an electroluminescent organic polymer material include polyphenylene vinylene referred to as PPV and derivatives thereof.

A study of an organic emitting layer using organic polymer material as a material is currently conducted intensively, since it can be driven at a relatively low voltage, is low in the power consumption and is easy to comply with a large display screen of using an organic EL device. In addition, the organic emitting layer made of a organic polymer material as can be manufactured by a coating method such as an ink-jet method. Thus, productivity of the organic polymer EL device is significantly higher than the low-molecular organic EL device which uses a vacuum process.

The organic polymer EL display typically has a hole-injection layer arranged between the pixel electrode and the organic emitting layer in order to inject holes from the pixel electrode into the organic emitting layer efficiently. As the material of the hole-injection layer, oxides of the transition metal such as molybdenum oxide, tungsten oxide, vanadium oxide or the like are used (refer to, for example, Patent Documents 1-6).

In the case of the display panel using an organic polymer EL device, the material of an organic emitting layer (an organic polymer EL material) is arranged in each pixel according to the color (R, G or B) using a printing technology such as inkjet technology. Therefore, when printing with the ink containing the organic polymer EL material, it is necessary to prevent ink from intruding into neighboring pixel emitting light of the other color.

In order to prevent ink containing the organic polymer EL material from intruding into the neighboring pixels emitting light of the other color, there is a technology to provide a liquid repellent bank defining each pixel and dropping ink containing the organic polymer EL material exactly to each pixel in order to prevent the ink from intruding into the neighboring pixels (for example, refer to Patent Documents 7-12). In addition, to prevent the ink from flowing out from the area defined by the bank, there is known a technology to make the bank liquid repellent by treating the bank with UV light or plasma (refer to Patent Documents 9-12).

On the other hand, there is known a method to transform the surface property selectively by radiating the light to the organic thin film formed on the surface of the material (refer to, for example, Patent Document 13). These organic thin films whose property can be selectively transformed by the light radiation is in some cases referred to as "a self-assembly-monolayer (SAM)". For example, a self-assembly-monolayer (SAM) is known, in which the contact angle of water on the surface can be changed by the changing the molecular structure through the irradiation.

In addition, to improve affinity of the pixel electrode with the liquid material of the organic functional layer to be coated, a technology is known to form a metal oxide layer containing the transparent electrode material such as ITO on the surface of the pixel electrode (refer to, for example, Patent Document 14).

In addition, a technology is known to increase the work function of the anode surface by applying the oxidation treatment on the anode surface (refer to, for example, Patent Document 15).

CITATION LIST

Patent Literature

PTL 1
Japanese Unexamined Patent Publication No. 2007-288071
PTL 2
U.S. Patent Application Laid-Open No. 2008/0231179
PTL 3
Unexamined Patent Publication No. 2008-270731
PTL 4
U.S. Patent Application Laid-Open No. 2007/0065180
PTL Patent Document 5:U.S. Patent Application Laid-Open No. 2007/0290604
PTL 6
U.S. Patent Application Laid-Open No. 2005/0170208
PTL 7
Japanese Unexamined Patent Publication No. 2006-86128
PTL 8
U.S. Patent Application Laid-Open No. 2006/0170338
PTL 9
U.S. Patent Application Laid-Open No. 2005/0287392
PTL 10
U.S. Patent Application Laid-Open No. 2006/0223221
PTL 11
Japanese Unexamined Patent Publication No. 2005-158494
PTL 12
Japanese Unexamined Patent Publication No. 2006-278101
PTL 13
Japanese Unexamined Patent Publication No. 2006-188487
PTL 14
Japanese Unexamined Patent Publication No. 2007-324033
PTL 15
Japanese Unexamined Patent Publication No. 2006-294261

SUMMARY OF INVENTION

Technical Problem

In case the area to be coated with ink is defined by a bank, the bank is formed by patterning by means of photolithography or the like after forming an organic substance film such as polyimide by a coating method such as spin-coating, after laminating the hole-injection layer consisting of transition metal oxide on the pixel electrode. However, the hole-injection layer consisting of transition metal oxide is soluble in alkali or water, there was a case that the hole-injection layer was dissolved during the bank formation process using the developing fluid which is an alkaline solution.

In addition, it is also considered to define the area to be coated with ink by a self-assembly-monolayer (SAM) in place of polyimide resin. In case the area to be coated with ink is defined by the self-assembly-monolayer (SAM), after laminating a hole-injection layer consisting of transition metal oxide on the pixel electrode by sputtering or the like, the self-assembly-monolayer (SAM) is formed by a wet-process, and then ultraviolet light is radiated to the area to be coated with the ink to make the area lyophilic to pattern the area to be coated with ink in.

As seen above, even in case the area to be coated with ink is defined by the self-assembly-monolayer (SAM) in place of the bank, there was a case that the hole-injection layer was dissolved since the self-assembly-monolayer (SAM) is formed by a wet-process after the hole-injection layer is formed. When the hole-injection layer is dissolved, the injection efficiency of the hole is decreased and the luminance efficiency is decreased.

The object of the invention is to provide an organic EL device which can prevent the hole-injection layer consisting of transition metal oxide from dissolving during the production process and the manufacturing method thereof.

Solution to Problem

A first aspect of the invention relates to an organic EL device described below.

[1] An organic EL device comprising: a substrate, a pixel electrode arranged on the substrate, at least a part of a surface of the pixel electrode being oxidized, a bank arranged on the substrate and covering a part or whole of an edge of the pixel electrode, an organic functional layer arranged on the pixel electrode, and a liquid repellent organic film arranged on the bank and defining an area of the organic functional layer, wherein the oxidized surface of the pixel electrode has a hole injection function, and an edge of the bank is aligned with an edge of the oxidized surface of the pixel electrode.

[2] The organic EL device according to [1], wherein the liquid repellent organic film is not arranged on a portion of the bank surface, the portion lying at a periphery of the pixel electrode

[3] The organic EL device according to [1] or [2], wherein the bank is an insulating inorganic film.

[4] The organic EL device according to any one of [1] to [3], wherein the organic functional layer is also arranged on a portion of the bank surface, the portion lying at a periphery of the pixel electrode.

[5] The organic EL device according to any one of [1] to [4], wherein the pixel electrode comprises a metal layer and an oxide of a transition metal layer arranged on the metal layer.

[6] The organic EL device according to [5], wherein the metal layer is a light reflecting metal layer.

[7] The organic EL device according to [5] or [6], wherein the oxide of the transition metal is selected from silver oxide, molybdenum oxide, chromium oxide, vanadium oxide, tungsten oxide, nickel oxide, iridium oxide or an combination thereof.

[8] The organic EL device according to any one of [1] to [7], wherein the pixel electrode is an APC layer or a MoCr layer.

[9] The organic EL device according to any one of [1] to [8], wherein the liquid repellent organic film is a self-assembly-mono layer.

A second aspect of the invention relates to a manufacturing method of an organic EL device described below.

[10] A manufacturing method of an organic EL device, comprising: providing a substrate on which a pixel electrode is arranged, forming a bank covering a part or whole of an edge of the pixel electrode on the substrate, forming a liquid repellent organic film on the bank and on the pixel electrode, radiating a light selectively to an area of the pixel electrode to be coated with an organic functional layer, to oxidize a surface of the pixel electrode, and to change the liquid repellent organic film on the area to a lyophilic organic film or to remove the liquid repellent organic film on the area, and applying an ink containing an organic functional material on the area defined by the liquid repellent organic film to form the organic functional layer on the pixel electrode.

[11] The manufacturing method of the organic EL device according to [10], wherein the bank is an insulating inorganic film.

[12] The manufacturing method of the organic EL device according to [10] or [11], wherein the pixel electrode includes the metal layer and the transition metal layer arranged on the metal layer.

[13] The manufacturing method of the organic EL device according to [12], wherein the metal layer is a light reflecting metal layer.

[14] The manufacturing method of the organic EL device according to any one of [10] to [13], wherein the pixel electrode is an APC layer or a MoCr layer.

[15] The manufacturing method of the organic EL device according to any one of [10] to [14], wherein the liquid repellent organic film is a self-assembly-monolayer.

Advantageous Effects of Invention

In the invention, since the hole-injection layer is not dissolved in the production process of the device, an organic EL device having a hole-injection layer with an excellent surface condition can be obtained. Therefore, it is possible to provide an organic EL device with high luminance efficiency and low power consumption. In addition, according to the manufacturing method of the invention, patterning of the area to be coated with ink and formation of the hole-injection layer can be conducted simultaneously. Therefore, according to the invention, a manufacturing method of an organic EL device with a simplified process is provided.

DESCRIPTION OF EMBODIMENTS

Figure 1:
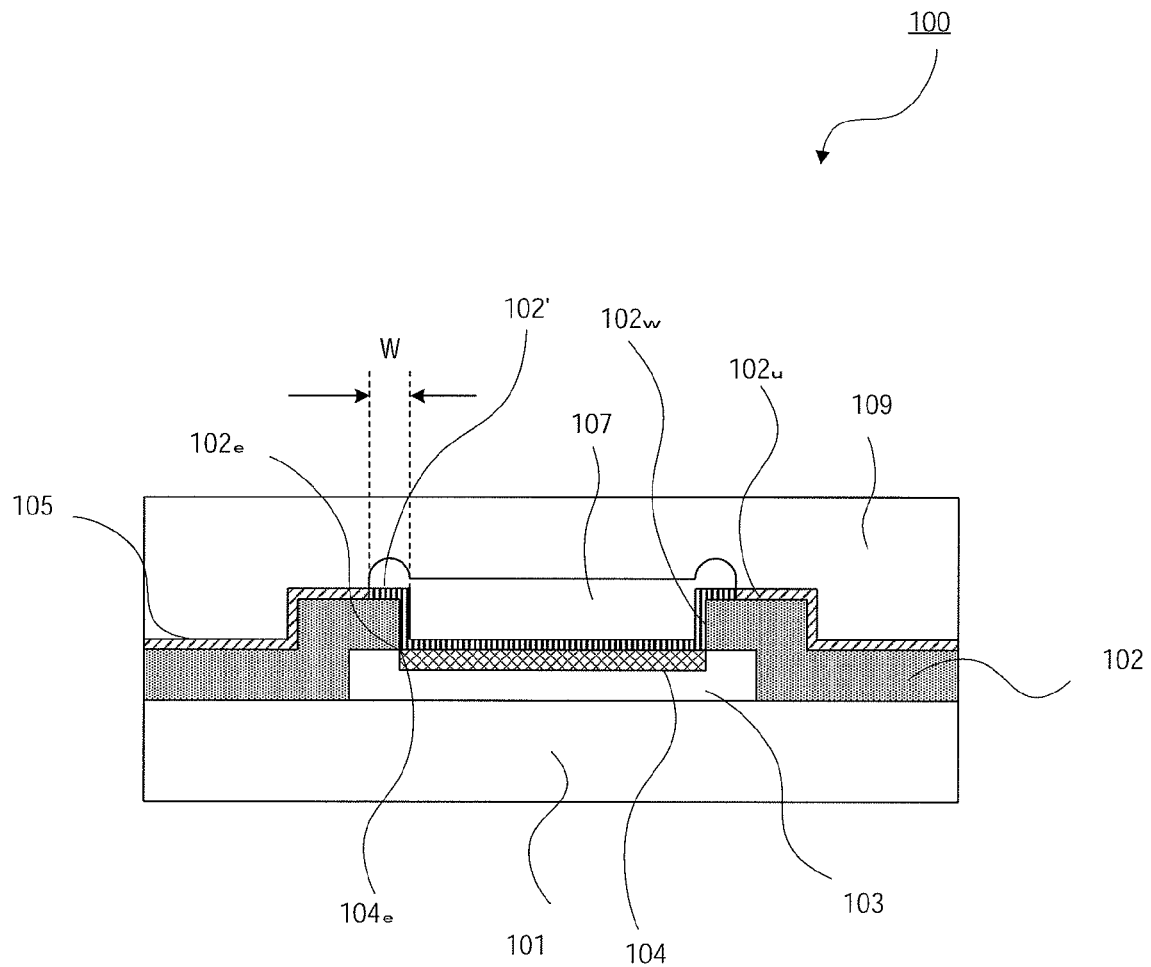
FIG. 1 is a sectional view of the organic EL device of Embodiment 1.

1. The Manufacturing Method of the Organic EL Device of the Invention

The manufacturing method of the organic EL device of the invention comprises four steps: 1) A first step for providing a substrate on which the pixel electrode is arranged; 2) A second step for forming a liquid repellent organic film on the pixel electrode and in the surrounding area of the pixel electrode; 3) A third step for radiating the light selectively to the area of the pixel electrode to be coated with the organic functional layer; 4) A forth step for forming an organic functional layer by a wet printing method in the area defined by the liquid repellent organic film.

The manufacturing method of the organic EL device of the invention is characterized in that the surface of the pixel electrode is oxidized in the third step after the liquid repellent organic film is formed. The oxidized surface layer of the pixel electrode can function as a hole-injection layer. As just described, since the hole-injection layer is formed after the liquid repellent organic film is formed in the invention, the hole-injection layer is not dissolved. Therefore, the hole-injection layer with excellent surface condition can be provided and an organic EL device with the high luminance efficiency can be produced.

In addition, in the manufacturing method of the organic EL device of the invention, by selectively radiating the light to the substrate in the third step, it is possible to change the liquid repellent organic film of the irradiated area to the lyophilic organic film or to remove the liquid repellent organic film of the irradiated area while forming the hole-injection layer. By changing the liquid repellent organic film to the lyophilic organic film or by removing the liquid repellent organic film, the liquid repellent organic film which defines the area to be coated with the organic functional material is patterned in the forth step.

As just described, since formation of the hole-injection layer and patterning of the area to be coated with the organic functional material can be conducted simultaneously in the invention, the organic EL device can be produced more simply.

Each step will be explained in detail below.

1) In the first step, a substrate on which a pixel electrode is arranged is provided. The pixel electrode is formed by forming a film of the electrode material on the substrate, for example, by a sputtering method; laying a mask made of a resist on the film of the electrode material; patterning the film of the electrode material by etching. The film thickness of the pixel electrode is preferably approximately 100 to 200 nm. When the thickness of the pixel electrode is too small, film thickness tends to be non-uniform and the hole injection efficiency is decreased, when the surface layer of the pixel electrode is converted to the hole-injection layer in the third step to be described later.

The pixel electrode may be composed of one metal layer or may be composed of a laminate of two or more metal layers. In the case pixel electrode is composed of one metal layer, the material of the pixel electrode is preferably a material whose oxide has a large work function. Examples of these materials include transition metals or alloys containing transition metals. Preferable examples of transition metals include silver, molybdenum, chromium, vanadium, tungsten, nickel, iridium and the like, and the preferable example of the alloys containing transition metals include silver-palladium-copper alloy (also referred to as APC) and molybdenum chromium alloy (also referred to as MoCr).

On the other hand, in the case pixel electrode is composed of a laminate of two or more metal layers, the material of the metal layer constituting the surface layer may be the material whose oxide has a large work function, and the material of the underlayer may be the material having superior electrical conductivity. Here, the surface layer means a layer having the surface in contact with the organic functional layer (described later) and the underlayer means a layer having the surface in contact with the substrate. As described later, since the surface layer of the pixel electrode is oxidized and converted to the hole-injection layer, in the case the pixel electrode is composed of a laminate of plural metal layers, as the material of the surface layer, a metal suitable for the hole-injection layer may be selected, and the material of the underlayer may be any material.

For example, in case the organic EL device is of a top emission type and the pixel electrode is composed of two metal layers, the material of the underlayer may be a metal having a high light reflection rate (for example, the reflection rate of the visible light is 60% or more) and the material of the surface layer may be a transition metal. More specifically, the material of the underlayer may be silver, aluminum or an alloy containing thereof, specifically, a metal having the high light reflectivity such as silver-palladium-copper alloy (referred to as APC), a silver-ruthenium-gold alloy (referred to as ARA), MoCr (molybdenum chromium), an aluminum-neodymium alloy or NiCr (nickel chromium); and the material of the surface layer may be silver, molybdenum, chromium, vanadium, tungsten, nickel, iridium or an alloy thereof. In addition, in case the pixel electrode is composed of two metal layers, it is preferable that the thickness of the surface layer is 20 nm or less and the thickness of the underlayer is 100-20 nm.

In addition, a bank defining a light emitting area on the substrate may be formed after the first step and before the second step. The bank is preferably formed so that a part or whole of the edge of the pixel electrode is covered (Refer to FIG. 3).

In case the material of the bank is an inorganic substance, the bank is formed by forming inorganic substance film, for example, by sputtering, and patterning the film by etching. On the other hand, in case the material of the bank is an organic substance, the bank can be formed by forming a resin film, for example, by coating method, and patterning the film by photolithography.

2) In the second step, a liquid repellent organic film is formed on the pixel electrode surface and in the surrounding area of the pixel electrode. The liquid repellent organic film is preferably a monomolecular film. Because the monomolecular film hardly affects on the organic functional layer formed on the pixel electrode. In addition, the liquid repellent organic film preferably has photosensitivity to be changed to a lyophilic organic film, to be decomposed or to be removed upon irradiation. A liquid repellent organic film meeting these conditions can be a self-assembly-monolayer (SAM) having the liquid repellency.

A self-assembly-monolayer (SAM) is a film formed by orientating a linear molecule having a binding functional group to the constituting atom of the surface of the coated body. The self-assembly-monolayer (SAM) includes a monomolecular film, an LB film (monomolecular film assemblies) and the like. Since the self-assembly-monolayer (SAM) is formed by orientating molecules, it has an extremely thin film thickness, and in addition it becomes a uniform film in a molecular level. That is, the same molecule is arranged on the surface of the film and then uniform and excellent liquid repellency can be provided on the surface of the film.

The method to form the self-assembly-monolayer (SAM) is not limited particularly. For example, self-assembly-monolayer (SAM) can be obtained by heating and drying the coating film obtained by coating an ethanol solution or the like containing an organic molecule forming the liquid repellent organic film on the pixel electrode surface and on the surrounding area of the pixel electrode according to the known coating method. The examples of the known coating methods include the dip method, the spin coating method, the spraying method, the roller coating method, the Myerbar method, the screen printing method, the brush coating method and the like.

3) In the third step, the light is radiated selectively to the area of the pixel electrode to be coated with organic functional layer. In order to radiate the light selectively to the area of the pixel electrode to be coated with organic functional layer, the light may be radiated through the mask. The irradiation site may be adjusted either by adjusting the area of the aperture of the mask or by adjusting the gap between the mask and the substrate.

Light radiation is preferably conducted in the chamber. The wavelength of the radiated light is from 1509 to 400 nm. The irradiance level (illumination intensity×illumination time) of light is not limited particularly. In order to denature the SAM film, it is often required the irradiance level of approximately 1-30 J/cm2. In addition, the irradiance level is adjusted so that the surface of the pixel electrode is sufficiently oxidized. By radiating the light selectively to an area of the pixel electrode, the surface of the pixel electrode is oxidized and the surface layer of the pixel electrode is converted to the hole-injection layer.

In addition, it is possible to selectively change a part of the liquid repellent organic film to the lyophilic organic film or to selectively remove a part of the liquid repellent organic film by selectively radiating the light to the area in which the pixel electrode is included. By so doing, patterning of the liquid repellent organic film which defines the area to be coated with the ink containing the organic functional material to be described later is carried out. The area to be coated with the ink containing the organic functional material includes at least a part of the pixel electrode. Also, it is preferable the area to be coated with the ink containing the organic functional material includes the periphery of the pixel electrode (refer to FIG. 3,5,8).

Other examples of means for oxidizing the surface of the pixel electrode include the ultraviolet ozone treatment, the plasma treatment under the atmosphere of oxidative gas, the treatment with a solution containing ozone, and the like. The specific conditions for the treatment of ultraviolet ozone treatment and the plasma treatment under the atmosphere of oxidative gas are set as appropriate referring to Japanese Unexamined Patent Publication No. 2006-294261.

4) In the forth step, the organic functional layer is formed by a wet printing method on the area defined by the liquid repellent organic film. The examples of the wet printing method include ink-jet, dispenser, nozzle coat, spin coat, intaglio printing, anastatic printing and the like. As a result of forming the organic functional layer by a wet-printing method, an organic layer with uniform film thickness can be easily provided on the substrate of a large screen.

More specifically, in the forth step, the ink containing the organic functional material is applied to the area defined by the liquid repellent organic film. By drying the applied ink, an organic functional layer is formed on the pixel electrode. The ink containing the organic functional material can be prepared by dissolving the organic functional material in the organic solvent such as anisole and cyclohexylbenzene.

The organic EL device is manufactured by laminating the opposite electrode after the organic functional layer is formed, and further forming a passivation layer.

As just described, according to the manufacturing method of the organic EL device of the invention, since the hole-injection layer is formed after the liquid repellent organic film is formed, the hole-injection layer surface is secure from dissolving and then an organic EL device having the hole-injection layer with excellent surface condition is obtained.

Thus, an organic EL device with high luminance efficiency and low power consumption can be provided.

In addition, according to the manufacturing method of the invention, the patterning of the area to be coated with the ink containing the organic functional material and the formation of the hole-injection layer can be conducted simultaneously. Therefore, according to the invention, the manufacturing method of the organic EL device with simplified process is provided.

2. The Organic EL Device of the Invention.

The organic EL device of the invention is an organic EL device produced according to the manufacturing method of the organic EL device of the invention described above.

The organic EL device of the invention comprises a substrate, a pixel electrode arranged on the substrate, an organic functional layer arranged on the pixel electrode, a liquid repellent organic film defining the area of the organic functional layer and an opposite electrode arranged on the organic functional layer. Each constituting member will be explained below.

[Substrate]

The material of the substrate is different depending on whether the organic EL device is of a bottom emission type or of a top emission type. For example, in the case of a bottom emission type, it is required that the substrate is transparent. Therefore, in the case of bottom emission type, the examples of the material of the substrate include glass, quartz, transparent plastics and the like. On the other hand, in the case of the top emission type, it is not required that the substrate is transparent. Therefore, in the case of a top emission type, the material of the substrate is not limited so long as it is an insulating body, for example, non-transparent plastics or metals.

When plastics such as polyethylene terephthalate, poly ether sulphone or the like are used as a material of the substrate, it is also possible to produce a flexible organic EL device. In addition, metal wiring and transistor circuit for driving the organic EL device may be formed on the substrate.

[Pixel Electrode]

The pixel electrode is a conductive member arranged on the substrate. The pixel electrode typically functions as an anode, however it may functions as a cathode.

The organic EL device of the invention is characterized in that at least one part of the surface of the pixel electrode is oxidized. That is, the pixel electrode of the organic EL device of the invention comprises a metal layer and a metal oxide arranged on the metal layer. The surface of the oxidized pixel electrode has preferably a high work function. Examples of these metal oxides include the transition metal oxide and the like. These transition metal oxides include silver oxide, molybdenum oxide, chromium oxide, vanadium oxide, tungsten oxide, nickel oxide, iridium oxide, an combination thereof, a laminate thereof and the like.

In the invention, the surface of the oxidized pixel electrode (oxidized surface layer) has a hole injection function. Therefore, the oxidized surface layer of the pixel electrode functions as a hole-injection layer. The thickness of the hole-injection layer (oxidized surface layer of the pixel electrode) is preferably 0.1-100 nm, more preferably 1-10 nm. When the hole-injection layer is too thin, the film thickness of the hole-injection layer tends to be non-uniform, and there is a case that the hole injection function becomes low. On the other hand, when the thickness of the hole-injection layer is too large, the driving voltage of the organic EL device becomes high and the power consumption is increased.

The thickness of the oxidized surface layer of the pixel electrode can be measured by investigating presence and absence of oxygen by the secondary ion mass spectrometer (Quadra-Pole SIMS measurement). On the other hand, the material of the underlayer of the pixel electrode is different depending on whether the organic EL device is of a top emission type or of a bottom emission type. When the organic EL device is of a top emission type, since the pixel electrode is a repeller, the material of the underlayer is preferably a metal having high light reflectivity (for example, the reflection rate of visible light is 60% or more) and high electrical conductivity. Examples of these metals having high light reflectivity and high electrical conductivity include silver, aluminum, an alloy thereof and the like. More specific examples of metals of high light reflectivity and high electrical conductivity include silver-palladium, a silver-palladium-copper alloy (referred to as APC), a silver-ruthenium-gold alloy (referred to as ARA), MoCr (molybdenum chromium), an aluminum-neodymium alloy or NiCr (nickel chromium) and the like; The film thickness of the pixel electrode is preferably 100-200 nm.

[Liquid Repellent Organic Film]

The liquid repellent organic film defines the area of the organic functional layer. The liquid repellent organic film is preferably a self-assembly-monolayer (SAM) such as a monomolecular film and an LB film. The liquid repellent organic film is more preferably a monomolecular film with the thickness of 10 Å-100 Å. More specifically, the liquid repellent organic film is preferably the self-assembly-monolayer (SAM) consisting of fluoroalkylsilane, for example, heptadecafluoro-1,1,2,2tetrahydrodecyltriethoxy silane, heptadecafluoro-1,1,2,2 tetrahydro decyltrimethoxy silane, heptadecafluoro-1,1,2,2 tetrahydro decyltrichlorosilane, tridecafluoro-1,1,2,2 tetrahydrooctyltriethoxysilane, tridecafluoro-1,1,2,2 tetrahydrooctyl triethoxysilane, tridecafluoro-1,1,2,2 tetrahydrooctyltrichlorosilane, trifluoropropyl trimethoxysilane and the like.

FAS is generally represented by the structural formula $RnSiX(4-n)$. Here, n represents an integer $1 \leq n \leq 3$, X represents a hydrolyzable group such as a methoxy group, an ethoxy group, a halogen atom or the like. In addition, R is a fluoroalkyl group and have the structure, $(CF_3)(CF_2)x(CH_2)y$ [wherein, x represents an integer $0 \leq x \leq 10$, y represents an integer $0 \leq y \leq 4$]. In the case plural Rs or Xs attach to Si, each of Rs or Xs may be the same or different. The hydrolyzable group represented by X forms the silanol group by hydrolysis and reacts with the hydroxy group of the surface of the bank or the substrate (such as $SiO_2$) to bind with the surface of the bank or the substrate via siloxane binding. On the other hand, R has a fluoro group such as $(CF_3)$ on the surface, the surface on which a monomolecular film of FAS is formed has the liquid repellency.

As described above, the organic EL device of the invention may have a bank. The bank is arranged on the substrate such that at least a part of the pixel electrode is exposed.

The material of the bank is preferably an insulating body (the resistivity of $105\Omega \cdot cm$ or more). When resistivity of the material of the bank is $105\Omega \cdot cm$ or less, a leakage current may arise between the pixel electrode and the opposite electrode or among neighboring pixels. When the leakage current arises, various problems occur such as increase of the power consumption.

Examples of the material of these banks include organic substances such as polyimide and polyacrylic, and inorganic substances such as silicon oxide. When the bank includes the organic substance, fluorine may be introduced to the organic substance which is the material of the bank. In addition, the bank may be two layer bank consisting of the inorganic underlayer and the organic upper layer.

The preferable material of the bank is an inorganic substance. Because, when the material of the bank is the organic substance, the surface of the pixel electrode is exposed to the danger of contamination of the out-gas generated from the bank or the residues of the bank. In addition, when the material of the bank is an inorganic substance, it is preferable since the insulation breakdown is hardly occur even the bank is made to be thin. As the inorganic bank material, any substance may be applicable so far as pinholes are hardly generated and insulation properties are excellent.

The thickness of the bank is preferably thin from the view point of the efficiency of luminance of the organic emitting layer described later. However, when it is too thin, pinholes can be generated and the insulation cannot be held. The thickness of the bank is preferably 10-200 nm, more preferably 10-100 nm.

The liquid repellent organic film is different in the aspect of arrangement depending on whether the organic EL device has a bank (Embodiments 1 and 2) or not (Embodiment 3).

[Organic Functional Layer]

The organic functional layer is a layer containing at least an organic emitting layer. The organic functional layer is formed on the pixel electrode by a wet printing method. The thickness of the organic functional layer is not particularly limited, and, for example, it may be approximately 50-200 nm.

The organic EL material contained in the organic emitting layer of the organic functional layer is appropriately selected according to the color (R, G or B) of the light emitted by the subpixel (an organic EL device). The organic EL material may be either an organic polymer EL material or a low molecular organic EL material, however, the organic polymer EL material is preferable. This is because, by using the organic polymer EL material, the organic emitting layer can be easily formed by a coating method without damaging the other members. Examples of organic polymer EL material include polyphenylene vinylene and the derivatives thereof, polyacetylene and the derivatives thereof, polyphenylene (PP) and the derivatives thereof, polyparaphenyleneethylene and the derivatives thereof, poly-3-hexylthiophene (P3HT) and the derivatives thereof, polyfluorene (PF)) and the derivatives thereof and the like. Examples of the low molecular organic EL material include tris (8-quinolinolato) aluminium and the like.

The organic functional layer may have a hole transport layer (an interlayer), an electron-injection layer, an electron transport layer and the like, in addition to an organic emitting layer.

The hole transport layer has a function to efficiently transfer the hole to the organic emitting layer and a function to block the intrusion of electrons to the pixel electrode (or the hole-injection layer). Therefore, the hole transport layer is arranged between the pixel electrode and the organic emitting layer. The material of the hole transport layer may be either the macromolecular material or the low molecular material so long as it is an organic material that transports the hole. Examples of the material for transporting the hole include a copolymer containing a fluorene site and a triarylamine site or a low molecular weigh triarylamine derivative and the like.

In addition, when the ink containing the organic light-emitting material is applied on the hole transport layer, it is preferable that the hole transport material in the hole transport layer is cross-linked so that the hole transport material is prevented from elution. In order to cross-link the hole transport material, the cross-linking agent may be concluded in the material solution of the hole transport layer. Examples of the cross-linking agent include, for example, dipentaerythritol hexaacrylate and the like. The hole transport layer can be formed by applying the material solution of the hole transport layer (for example, a solution of the hole transport layer dissolved in an organic solvent such as anisole and cyclobenzene) on the pixel electrode (or the hole-injection layer). The thickness of the hole transport layer is not particularly limited, and it may be, for example, approximately 10-40 nm.

[Opposite Electrode]

The opposite electrode is a conductive member arranged on the organic functional layer. The opposite electrode typically functions as a cathode, however, may function as an anode.

The material of the opposite electrode is different depending on whether the organic EL device is of a bottom emission type or of a top emission type. When the organic EL device is of a top emission type, since the opposite electrode is required to be transparent, it is preferable that the material of the opposite electrode is a conductive member has a transmissivity of 80% or more. By so doing, a top emission organic EL device with high luminance efficiency can be obtained, and thus an organic EL device with low power consumption and long life can be obtained.

These transparent cathode may be composed of a layer containing an alkali earth metal, a layer consisting of an electron transportable organic material and a metal oxide layer. Examples of alkali earth metals include magnesium, calcium, barium and the like. An electron transportable organic material is, for example, an organic semiconductor material. The metal oxide is not particularly limited, however, for example, it may be indium tin oxide or indium zinc oxide.

In addition, the transparent cathode may be composed of a layer containing an alkali metal, an alkali earth metal or a halogenated compound thereof and a layer containing silver. The layer containing silver may be composed of only silver or may be composed of a silver alloy. In addition, a highly transparent layer controlling the refractive index may be provided on the layer containing silver. By providing a layer controlling the refractive index, it is possible to increase efficiency to take out the light.

On the other hand, when the organic EL device is a bottom emission type, the material of the opposite electrode may be any so long as it is electrically-conductive.

Referring to the drawings, embodiments of the organic EL device of the invention will be explained below.

(Embodiment 1)

In the embodiment, an organic EL device having a bank will be explained.

FIG. 1 shows a sectional view of organic EL device 100 of the embodiment. As shown in FIG. 3, organic EL device 100 of the embodiment has substrate 101, pixel electrode 103, bank 102, liquid repellent organic film 105, organic emitting layer 107 and opposite electrode 109.

The material of substrate 101 is glass or the like. In addition, metal wiring and transistor circuit may be formed in substrate 101.

Pixel electrode 103 is arranged on substrate 101 and has oxidized surface layer 104. Oxidized surface layer 104 of pixel electrode 103 functions as a hole-injection layer. In the embodiment, the pixel electrode is composed of a metal layer of one layer, which is an APC film or a MoCr film. Typically, plural pixel electrode 103 are arranged in a matrix state on substrate 101.

Bank 102 is arranged on substrate 101, and covers a part or whole of the edge of pixel electrode 103. The thickness of bank 102 is preferably 10-100 nm. Examples of the material of bank 102 include insulating inorganic substances such as $SiO_2$, SiN, SiON, $Al_2O_3$, MN and the like. Bank 102 has upper face 102 $u$ and wall face 102 $w$. Bank 102 may be either forward tapered or inversely tapered. In addition, wall face 102 $w$ of the bank may be perpendicular to substrate 101. When bank 102 is forward tapered, in the production step of the organic EL device, the liquid repellent organic film becomes easy to be formed on bank 102.

In addition, bank 102 may be arranged on pixel electrode 103. When bank 102 is arranged on pixel electrode 103, only the surface of pixel electrode 103 which is not covered by bank 102 is oxidized. Therefore, the surface of pixel electrode 103 arranged under bank 102 is not oxidized. As a result, edge 102$e$ of bank 102 is aligned with the edge 104 $e$ of oxidized surface layer 104. Here, "the surface of the pixel electrode is not oxidized" means that the surface of the pixel electrode is not oxidized at all or even when oxidized, the thickness of the oxidized layer is 1 nm or less.

Generally, the density of a metal is higher than that of oxide of the metal. For example, while the density of tungsten is 19.25 $g/cm^3$, the density of tungsten oxide is 7.16 $g/cm^3$. Therefore, when the surface of the pixel electrode is completely oxidized, the density of the surface layer of the pixel electrode decreases and there is a risk that water and the other foreign material intrude in the organic emitting layer from the substrate side through the surface layer of the pixel electrode.

However, in the embodiment, since only a part of the pixel electrode surface (the surface area of the pixel electrode which is not covered by the bank) is oxidized, compared with the case in which the entire surface of the pixel electrode is oxidized, the density of the surface layer of the pixel electrode is high. Therefore, the intrusion of water and foreign material from the substrate side to the organic functional layer can be prevented.

Liquid repellent organic film 105 is arranged on the bank 102, and defines the area of organic luminescent layer 107 to be described later. In addition, liquid repellent organic film 105 is not arranged on the portion of the bank surface that lies at the periphery of the pixel electrode. Here, "the portion of the bank surface that lies at the periphery of the pixel electrode (hereinafter referred to as simply "peripheral portion 102'")" means the portion of the bank surface 1-10μ apart from the edge of bank 102. Therefore, the width W of peripheral portion 102' is 1-10 μm.

Organic emitting layer 107 is arranged in the area defined by liquid repellent organic film 105 as described above. As described above, since liquid repellent organic film 105 is not arranged on the portion of the bank surface that lies at the periphery of the pixel electrode, organic luminescent layer 107 is arranged not only on pixel electrode 103, but also on peripheral portion 102'. The thickness of organic emitting layer 107 is preferably 50-100 nm.

Figure 2A:
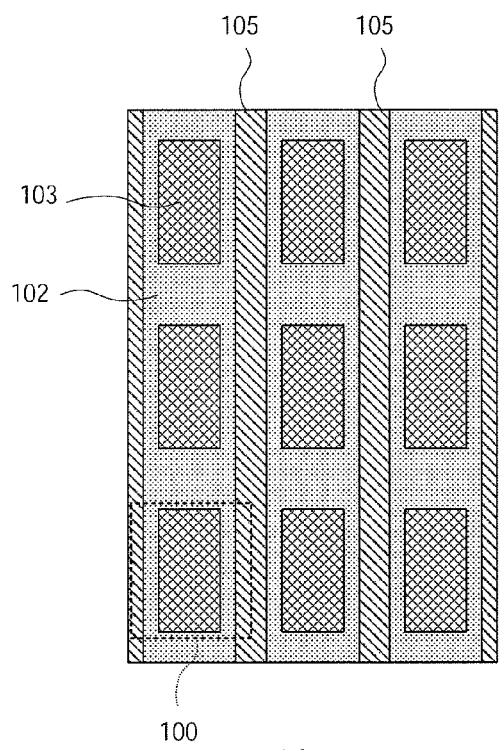
FIG. 2 is an enlarged plan view of the organic EL device of Embodiment 1.
Figure 2B:
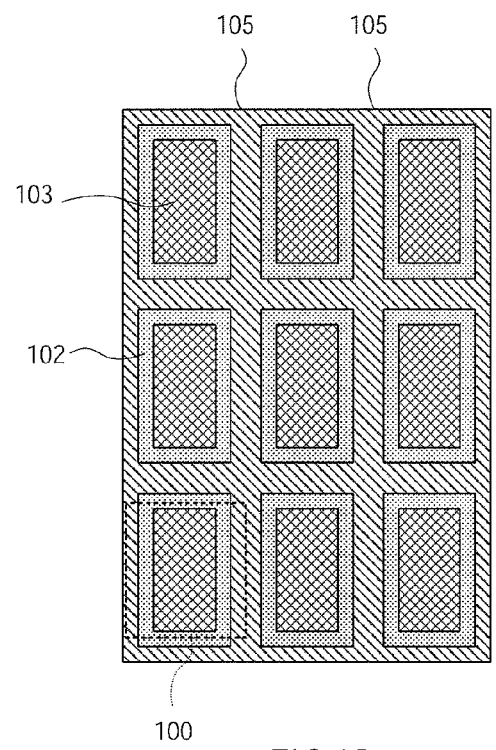
Figure 2C:
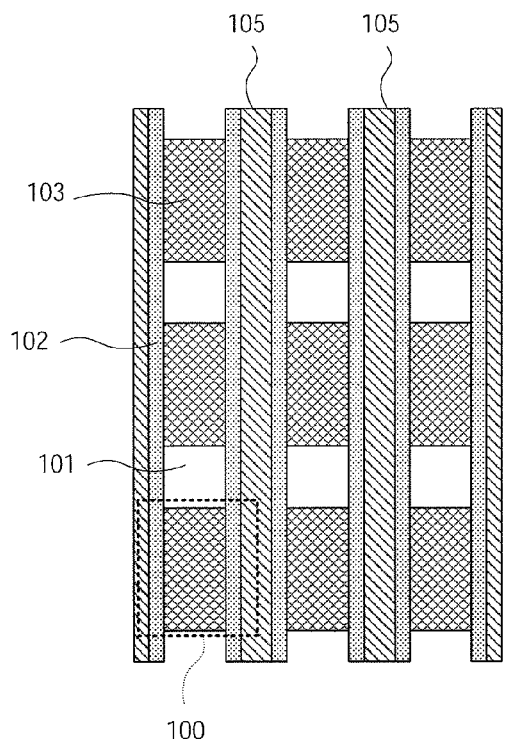
Figure 2D:
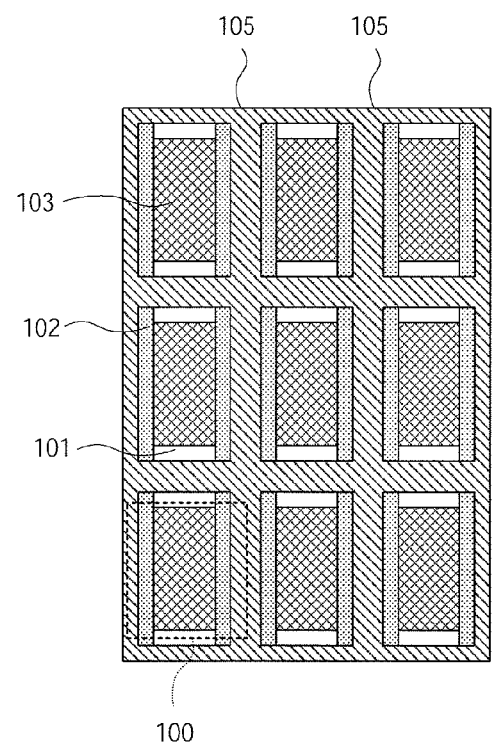

FIG. 2A-D show the enlarged view of a part of the organic EL display panel in which the organic EL device of Embodiment 1 whose opposite electrode and organic emitting layer are abbreviated is arranged in a matrix shape on the substrate. As shown in FIG. 2A and FIG. 2B, bank 102 may be arranged so that each pixel electrode 103 is surrounded by the bank. When bank 102 is arranged so that each pixel electrode 103 is surrounded, bank 102 covers the whole of the edge of pixel electrode 103. In addition, as shown in FIG. 2C and FIG. 2D, linear bank 102 may be arranged so that an array of pixel electrodes 103 (pixel electrodes 103 arranged in a row) is surrounded. When linear bank 102 is arranged so that the array of pixel electrodes 103 is surrounded, bank 102 covers a part of the edge of pixel electrode 103.

In addition, as shown in FIG. 2A and FIG. 2C, linear liquid repellent organic film 105 may be arranged to define the linear organic emitting layer (the organic emitting layer formed across the organic EL devices arranged in a row). In addition, as shown in FIG. 2B and FIG. 2D, liquid repellent organic film 105 may be arranged to define the organic emitting layer for each organic EL device 100.

The manufacturing method of the organic EL device of the embodiment will be explained below.

Figure 3A:
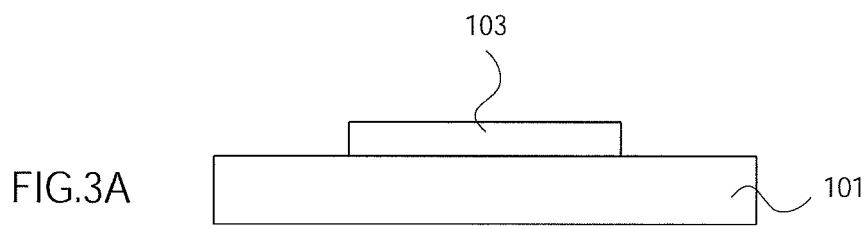
FIG. 3 is a figure to show the manufacturing method of the organic EL device of Embodiment 1.
Figure 3B:
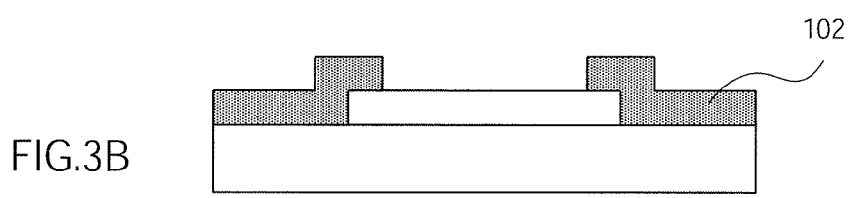
Figure 3C:
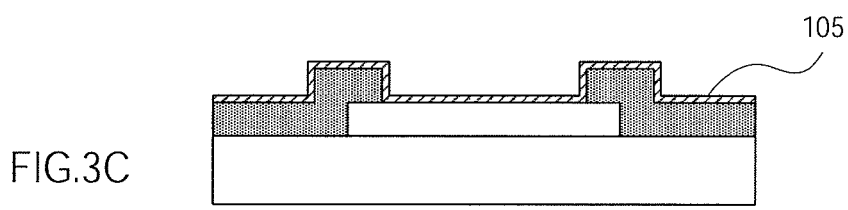
Figure 3D:
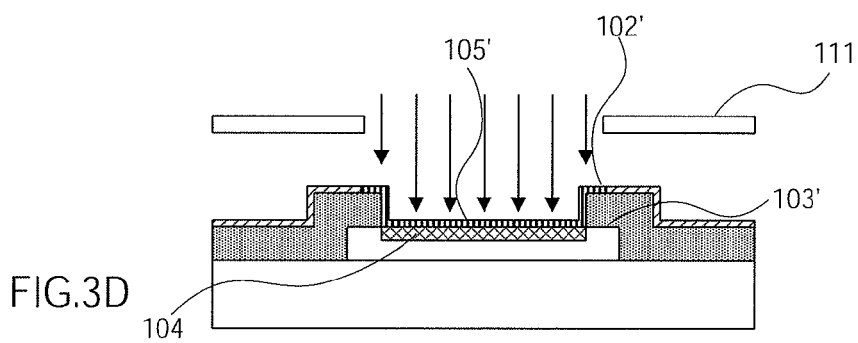
Figure 3E:
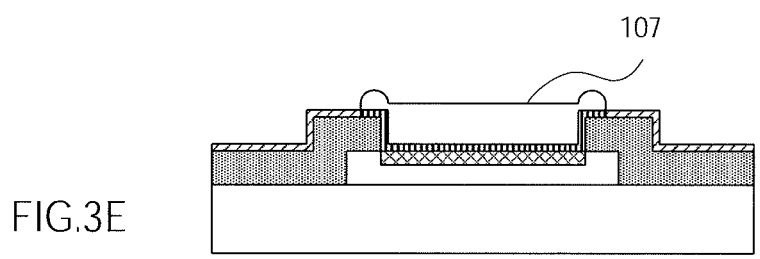

FIG. 3A-F show the manufacturing method of the organic EL device of Embodiment 1. As shown in FIG. 3A-F, the manufacturing method of the organic EL device of the embodiment has 1) the first step of providing substrate 101 on which pixel electrode 103 is arranged (FIG. 3A), 2) the second step of forming bank 102 covering a part or whole of the edge of pixel electrode 103 on substrate 101 (FIG. 3B), 3) the third step of forming liquid repellent organic film 105 on bank 102 and on pixel electrode 103 (FIG. 3C), 4) the forth step of radiating the light selectively to the area of pixel electrode 103 to be coated with organic emitting layer 107 (FIG. 3D), 5) the fifth step of forming the organic emitting layer by applying the ink containing the organic light-emitting material to the area defined by liquid repellent organic film 105 (FIG. 3E).

1) In the first step (FIG. 3A), substrate 101 is provided on which pixel electrode 103 is arranged.

2) In the second step, bank 102 is formed on the substrate (FIG. 3B). Bank 102 is formed to cover a part or whole of the edge of pixel electrode 103.

3) In the third step, liquid repellent organic film 105 is formed on bank 102 and pixel electrode 103 (FIG. 3C).

4) In the forth step, the light is selectively radiated to the area of pixel electrode 103 to be coated with the organic luminescent layer (FIG. 3D). In order to selectively radiate the light to the area to be coated with the organic luminescent layer, the light may be radiated through mask 111.

By radiating the light selectively to the area of electrode 103, the surface of pixel electrode 103 is oxidized and surface layer 104 of pixel electrode 103 is converted to the hole-injection layer. On the other hand, the surface of pixel electrode 103' which is protected by bank 102 (arranged under bank 102) is not oxidized. For this reason, the edge of bank 102 is aligned with the edge of the oxidized surface layer of pixel electrode 103.

In addition, by radiating the light selectively to the area of pixel electrode 103, it is possible to change a part of liquid repellent organic film 105 selectively to lyophilic organic film 105' or to remove selectively a part of liquid repellent organic film 105. By so doing, liquid repellent organic film 105 which defines the area to be coated with the organic light-emitting material is patterned. The area to be coated with the organic light-emitting material includes pixel electrode 103 and the portion of bank surface which lies at the periphery of pixel electrode 103 (peripheral portion 102'). Therefore, in this step, it is preferable to radiate the light to pixel electrode 103 and peripheral portion 102'. By so doing, not only liquid repellent organic film 105 on pixel electrode 103, but also liquid repellent organic film 105 on peripheral portion 102' is changed to lyophilic organic film 105' or removed.

5) In the fifth step, the ink containing the organic light-emitting material is applied to the area defined by liquid repellent organic film 105 (FIG. 3E). By drying the applied ink, organic emitting layer 107 is formed on pixel electrode 103.

As described above, not only liquid repellent organic film 105 on pixel electrode 103, but also the liquid repellent organic film on peripheral portion 102' is changed to lyophilic organic film 105' or removed. Therefore, the ink containing the organic light-emitting material is applied not only on pixel electrode 103, but also on peripheral portion 102'. As a result, organic emitting layer 107 with non-uniform film thickness is formed on peripheral portion 102' as shown in FIG. 3E. However, on pixel electrode 103 (light emitting area), organic emitting layer 107 with uniform film thickness is formed. By forming organic emitting layer with uniform film thickness in the light emitting area, the life of the organic EL device can be prolonged.

Figure 3F:
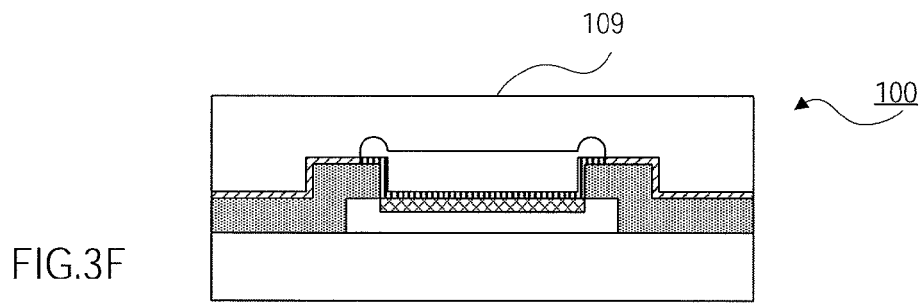

After forming organic emitting layer 107, opposite electrode 109 are laminated, and then forming further a sealant film, organic EL device 100 is manufactured (FIG. 3F).

As just described, in this embodiment, since the density of the surface layer of the pixel electrode is high, intrusion of water and foreign materials from the substrate side to the organic functional layer can be suppressed. In addition, according to the embodiment, since the hole-injection layer is formed after the liquid repellent organic film is formed, there is no risk that the surface of the hole-injection layer is dissolved, and so an organic EL device having the hole-injection layer with an excellent surface condition can be obtained. Therefore, it is possible to provide an organic EL device with high luminance efficiency and low power consumption. In addition, in the embodiment, patterning of the area to be coated with the organic functional material and formation of the hole-injection layer can be conducted simultaneously. By so doing, a manufacturing method of an organic EL device with a simplified process can be provided.

(Embodiment 2)

In Embodiment 1, an aspect in which the pixel electrode is composed of one metal layer was explained. In Embodiment 2, an example in which the pixel electrode is composed of two metal layers will be explained.

Organic EL device 200 of the embodiment is an organic EL device of a top emission type. Organic EL device 200 is the same as organic EL device 100 in Embodiment 1 except that the pixel electrode is composed of two metal layers and has the hole transport layer. Therefore, as for the same constituent element as organic EL device 100, the same reference number is attached and explanation will be omitted.

Figure 4:
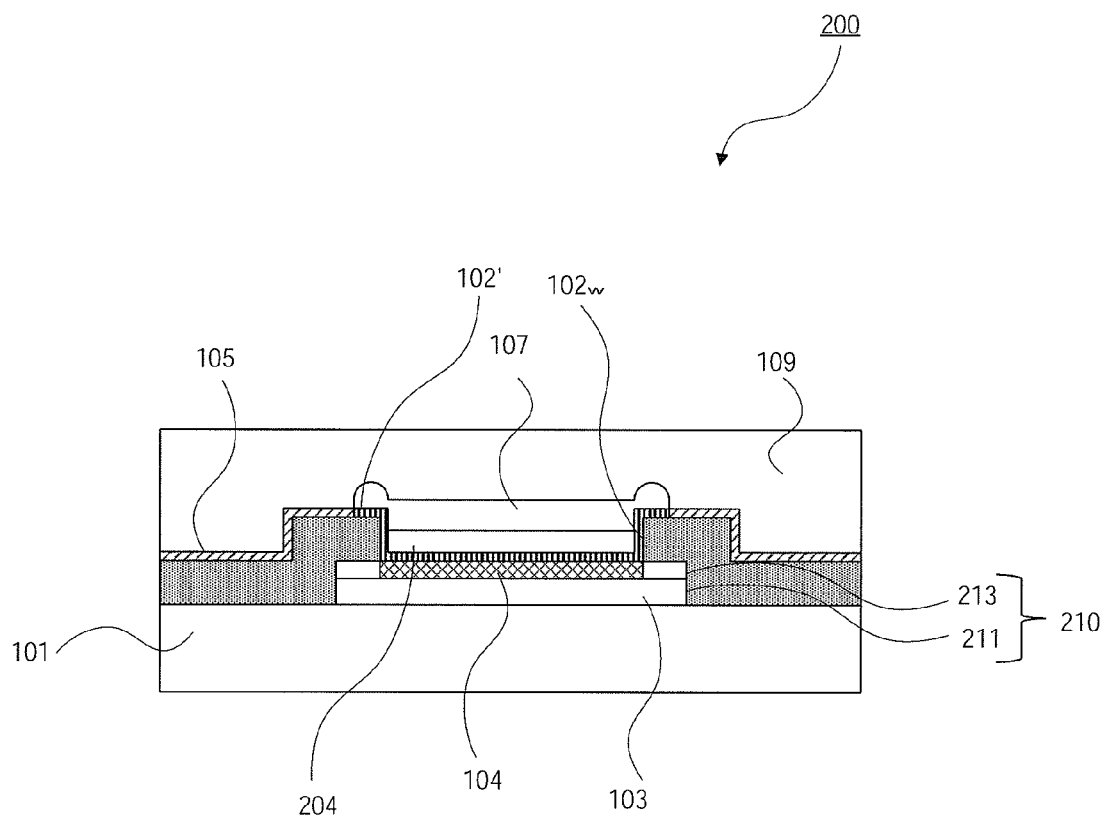
FIG. 4 is a sectional view of the organic EL device of Embodiment 2.

FIG. 4 shows a sectional view of organic EL device 200 of Embodiment 2. As shown in FIG. 4, organic EL device 200 of Embodiment 2 has pixel electrode 210 and hole transport layer 204.

Pixel electrode 210 is a light reflecting pixel electrode and composed of underlayer 211 and surface layer 213. As such, in the embodiment, pixel electrode 210 is composed of two metal layers. The material of underlayer 211 is a metal having the reflection rate of the visible light of 60% or more and the material of surface layer 213 is a metal whose oxide has a high work function. The light reflection rate of surface layer 213 is not necessary to be high. In addition, it is preferable that the thickness of surface layer 213 is 20 nm or less, and the thickness of underlayer 211 is 100-200 nm. When the thickness of surface layer 213 is 20 nm or more, there is a risk that the reflection rate of pixel electrode 210 as a whole decreases.

In the embodiment, among surface layer, the area which is not covered by bank 102 is oxidized. Surface layer 213 may be oxidized only at the surface, or as shown in FIG. 4, may be completely oxidized in the thickness direction.

Figure 5A:
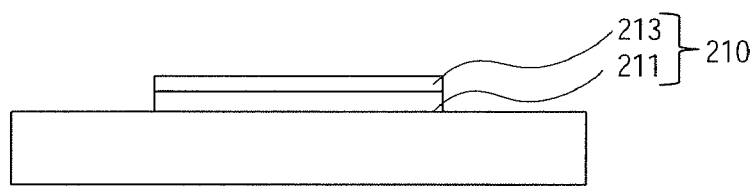
FIG. 5 is a figure to show the manufacturing method of the organic EL device of Embodiment 2.
Figure 5B:
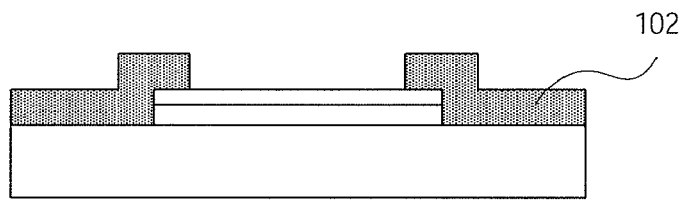
Figure 5C:
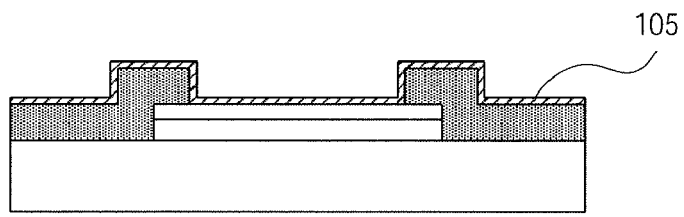
Figure 5D:
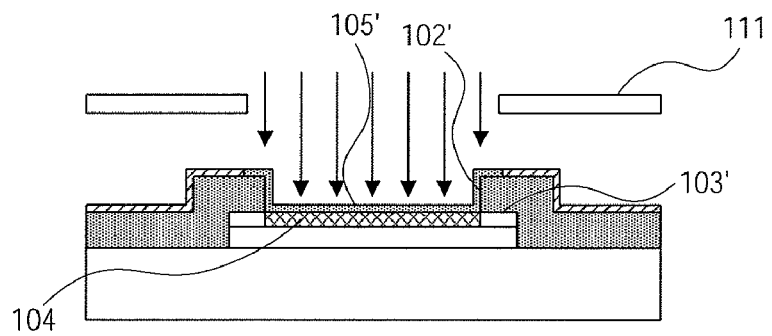
Figure 5E:
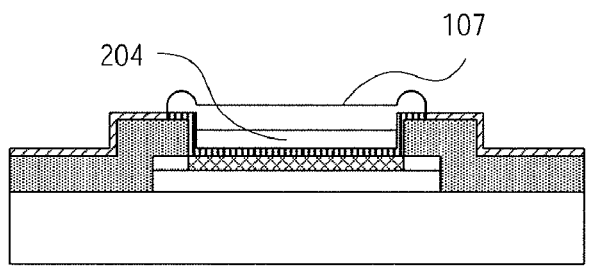
Figure 5F:
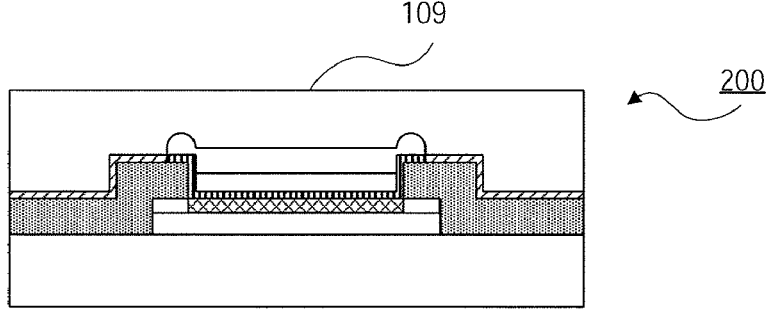

The manufacturing method of the organic EL device of the embodiment will be explained below. FIG. 5 shows the manufacturing method of the organic EL device of the embodiment. As shown in FIG. 5A-FIG. 5F, the manufacturing method of the organic EL device of Embodiment 2 has 1) the first step of providing substrate 101 on which pixel electrode 210 is arranged (FIG. 5A), 2) the second step of forming bank 102 covering a part or whole of the edge of pixel electrode 210 on substrate 101 (FIG. 5B), 3) the third step of forming liquid repellent organic film 105 on bank 102 and the surface of pixel electrode 210 (FIG. 5C), 4) the forth step of radiating the light selectively to the area of pixel electrode 210 to be coated with organic emitting layer 107 and hole transport layer 204 (FIG. 5D), 5) the fifth step of forming hole transport layer 204 and organic emitting layer 107 on pixel electrode 210 by applying the ink containing the material of the hole transport layer and the ink containing the organic light-emitting material to the area defined by the liquid repellent organic film 105 (FIG. 5E).

As such, according to the embodiment, as it is possible to form the pixel electrode with the high reflection rate by selecting a metal layer suitable for the hole-injection layer and selecting a metal layer suitable for the light reflecting electrode as the underlayer of the pixel electrode, the top emission type organic EL device with high luminance efficiency can be provided. In addition, according to the embodiment, it is also possible to adjust the optical distance with the surface layer. For the above reason, the organic EL device with higher luminance efficiency can be provided.

(Embodiment 3)

In Embodiments 1 and 2, an organic EL device having a bank was explained. On the other hand, in Embodiment 3, an organic EL device having no bank will be explained.

Organic EL device 300 of the embodiment is the same as organic EL device 100 of embodiment 100 except that it does not have bank 102. Therefore, the same symbols are attached to the same constitutional elements as organic EL device 100 and the explanation will be omitted.

Figure 6:
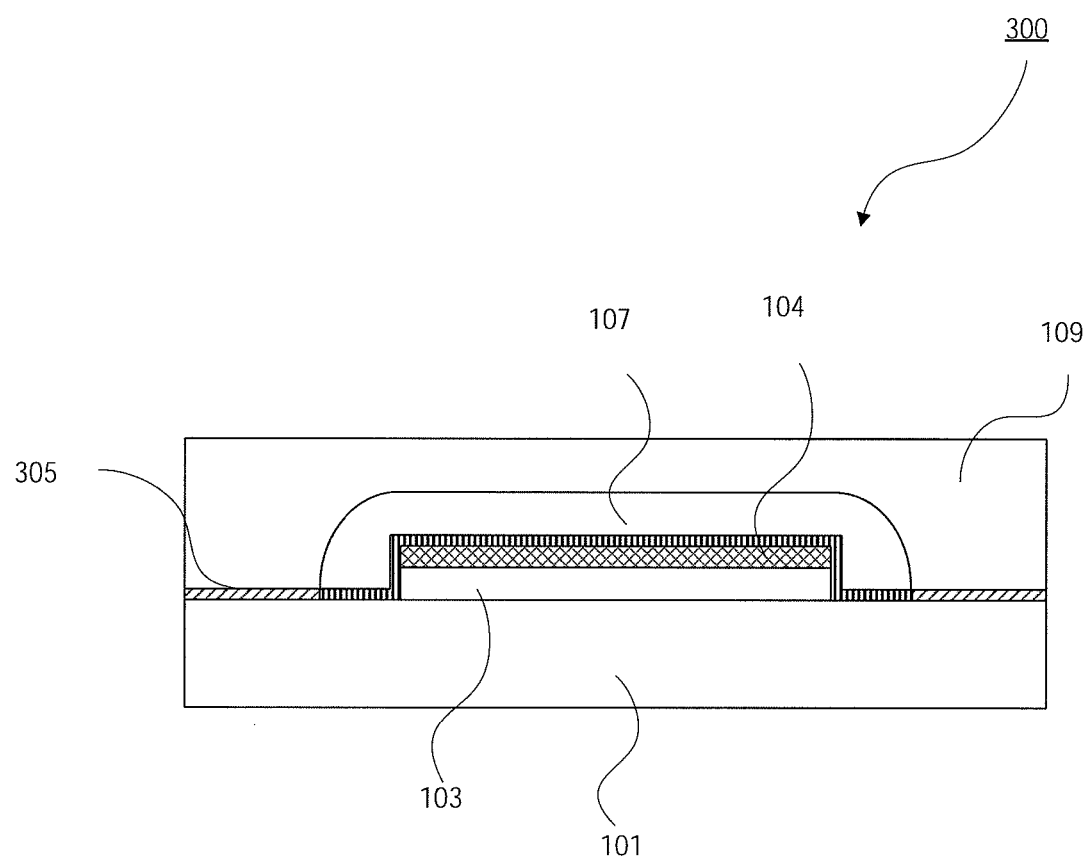
FIG. 6 is a sectional view of the organic EL device of Embodiment 3.

FIG. 6 is a sectional view of organic EL device 300 of the embodiment. Organic EL device 300 has substrate 101, pixel electrode 103, liquid repellent organic film 305, organic emitting layer 107 and opposite electrode 109.

Liquid repellent organic film 305 is arranged on substrate 101. In addition, liquid repellent organic film 305 is not arranged on the portion of substrate 101 which lies at periphery of pixel electrode 103. Liquid repellent organic film 305 defines the area of organic emitting layer 107. Organic luminescent layer 107 is arranged so as to cover pixel electrode 103. Therefore, organic luminescent layer 107 is also arranged on the portion of substrate 101 which lies at periphery of pixel electrode 103. Specifically, organic emitting layer 107 is also arranged on the portion of substrate 101, 1-10 μm from the edge of the pixel electrode 103.

Figure 7A:
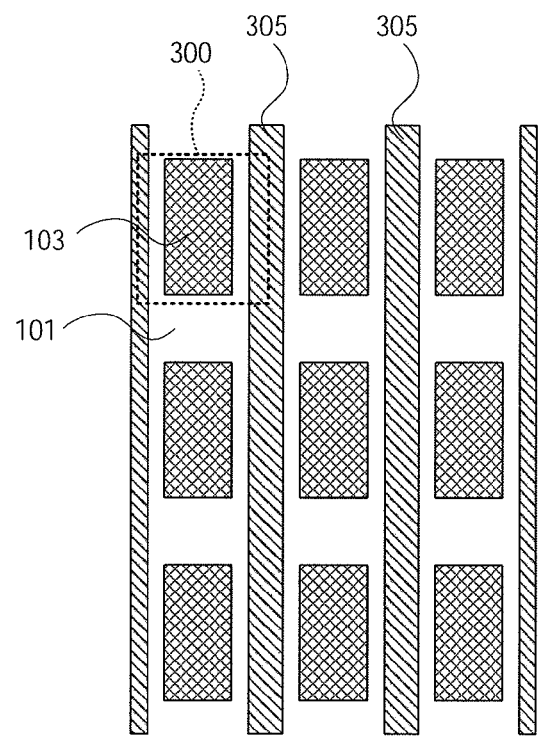
FIG. 7 is an enlarged plan view of the organic EL display panel having the organic EL device of Embodiment 3.
Figure 7B:
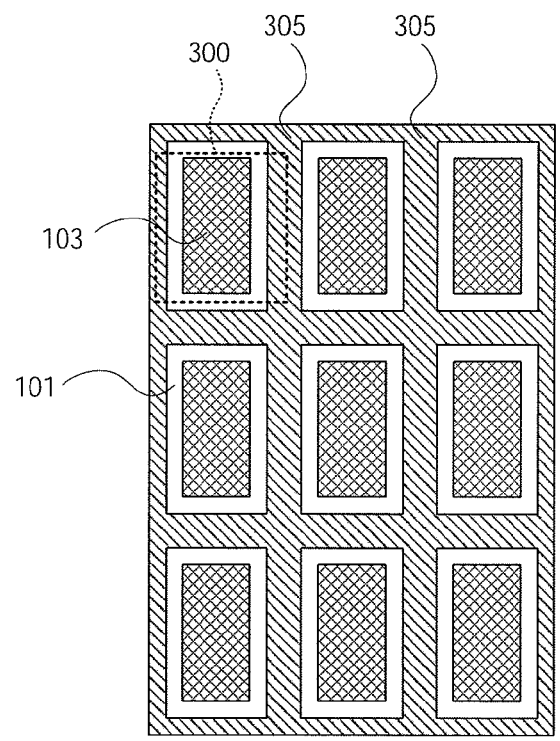

FIGS. 7A and 7B show a partially enlarged view of the organic EL display panel in which the organic EL device of embodiment 3 is arranged in a matrix state on the substrate. The opposite electrode and organic emitting layer are omitted in FIGS. 7A and 7B. As shown in FIG. 7A, liquid repellent organic film 305 may be arranged linearly so that it defines a linear organic emitting layer (an organic emitting layer formed across the organic EL devices arranged in a row.). In addition, as shown in FIG. 7B, liquid repellent organic film 305 may be arranged to define organic emitting layer 107 for each organic EL device 300.

Figure 8A:
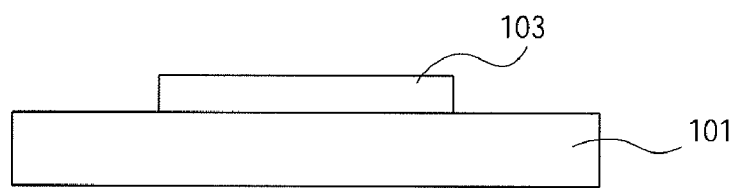
FIG. 8 is a figure to show the manufacturing method of the organic EL device of Embodiment 3.
Figure 8B:
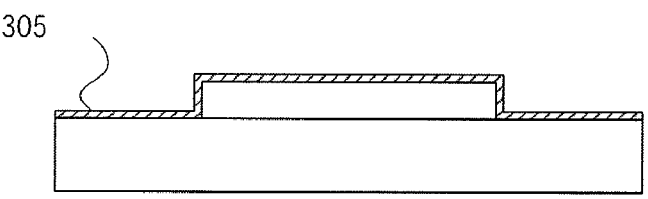
Figure 8C:
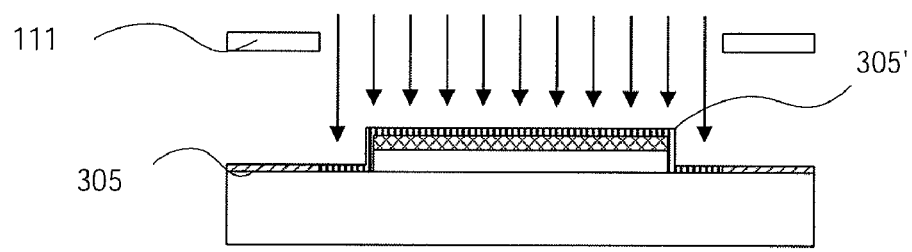
Figure 8D:
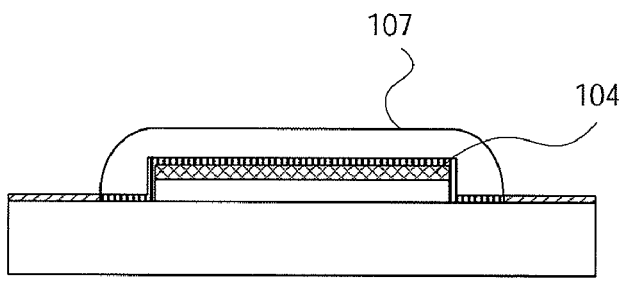

The manufacturing method of the organic EL device of the embodiment will be explained below. FIG. 8A-F show the manufacturing method of the organic EL device of the embodiment. As shown in FIG. 8A-FIG. 8F, the manufacturing method of the organic EL device of Embodiment 3 has 1) the first step of providing substrate 101 on which pixel electrode 103 was arranged (FIG. 8A), 2) the second step of forming liquid repellent organic film 305 on the surface of substrate 101 and pixel electrode 103 (FIG. 8B), 3) the third step of radiating the light selectively to the area of pixel electrode 103 to be coated with organic emitting layer 107 (FIG. 8C), 4) the forth step of forming organic emitting layer 107 on pixel electrode 103 by applying the ink containing the organic light-emitting material to the area defined by liquid repellent organic film 305 (FIG. 8D).

1) In the first step, substrate 101 on which pixel electrode 103 was arranged is provided.

2) In the second step, liquid repellent organic film 305 is formed on the substrate 101 and on the pixel electrode 103.

3) In the third step, the light is radiated selectively to the area of pixel electrode 103 to be coated with the organic emitting layer. In order to radiate the light selectively to the area including pixel electrode 103, the light may be radiated through mask.

By radiating the light selectively to the area of pixel electrode 103, the surface of pixel electrode 103 is oxidized and surface layer 104 of pixel electrode 103 may be made as the hole-injection layer.

In addition, by radiating the light selectively to the area of pixel electrode 103, the light is radiated selectively to a part of liquid repellent organic film 305, and the surface of pixel electrode 103 is oxidized. At the same time, it is possible to change a part of liquid repellent organic film 305 selectively to lyophilic organic film 305 or selectively remove a part of liquid repellent organic film 305. By so doing, patterning of liquid repellent organic film 305 which defines the area to be coated with the ink containing the organic light-emitting material is made. The area to be coated with the ink containing the organic light-emitting material includes pixel electrode 103, and preferably also includes the periphery of pixel electrode 103. Here, the periphery of pixel electrode 103 means an area 1-10 μm apart from the edge of pixel electrode 103. Therefore, in this step, it is preferable to radiate the light to pixel electrode 103 and the periphery of pixel electrode 103. By so doing, not only liquid repellent organic film 305 on pixel electrode 103, but also liquid repellent organic film 305 on the periphery of pixel electrode 103 is changed to lyophilic organic film 305' or removed.

4) In the fourth step, the ink containing the organic light-emitting material is applied to the area which is defined by liquid repellent organic film 305.

As described above, since not only liquid repellent organic film 305 on pixel electrode 103, but also liquid repellent organic film 305 of the periphery of pixel electrode 103 is changed to lyophilic organic film 305' or removed, the ink containing the organic light-emitting material is applied not only on pixel electrode 103, but also on substrate 101 of the periphery of pixel electrode 103. When the organic light-emitting material is applied to the periphery of pixel electrode 103, the thickness of organic emitting layer 107 becomes non-uniform in the periphery (non-light emitting area) of the pixel electrode 103, however on pixel electrode 103 (the light emitting area), organic emitting layer 107 having uniform film thickness is obtained. By forming an organic emitting layer having uniform film thickness in the light emitting area, the life of the organic EL device can be prolonged.

Figure 8E:
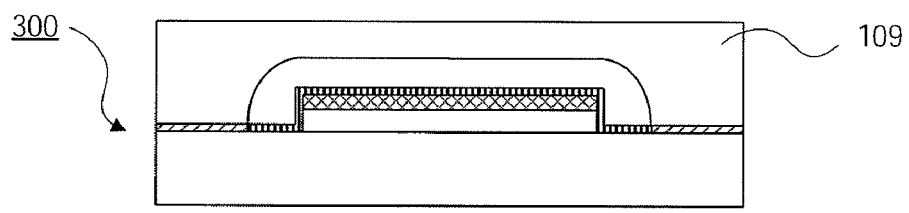

After organic emitting layer 107 is formed, by laminating opposite electrode 109 and further forming a sealant film, organic EL device 200 is produced (FIG. 8E).

As just described, in this embodiment, since a bank is not formed, the organic EL device can be produced with less steps.

To show that the surface layer of the pixel electrode oxidized by the light functions normally as a hole-injection layer, following example was conducted.

EXAMPLE 1

On the surface of a glass (manufactured by Matsunami Glass-containing no soda) substrate, a metal layer composing of molybdenum 97% and chromium 3% (hereinafter, also referred to as "MoCr (97:3)") of the film thickness of 100 nm was formed by sputtering. And using a photosensitive resist patterned by the photolithography as a mask, a metal layer was subjected to wet-etching. As an etching solution, a mixed solution of phosphoric acid, nitric acid and acetic acid was used. Then, the photosensitive resist was peeled off and the pixel electrode of a given shape was patterned.

By exposing the photosensitive polyimide formed by spin coating on the substrate where the pixel electrode was patterned to the light using a photomask and developing it, a bank was formed. Then, the substrate was washed using the neutral detergent and pure water.

Then, the pixel electrode was subjected to the UV-ozone treatment (with UV light having wavelength of 170 nm, for 120 second). By so doing, the surface of the pixel electrode was oxidized. The thickness of the metal oxide layer formed at the surface layer of the pixel electrode by the UV-ozone treatment was 5 nm.

Then, the fluorine plasma processing was conducted to make the bank liquid repellent. The condition of the fluorine plasma processing was as follows: chamber pressure was set to 20 Pa, CF4 flow rate was set to 80 sccm, RF power was set to 100 W, and treatment time was set to 30 second.

Then, HT 12 (manufactured by Sameishon K.K.) was dissolved in a mixed solvent of xylene and mesitylene to prepare a material solution of the hole transport layer. Then, the material solution of the hole transport layer was applied to the area defined by a bank by an ink-jet method. The applied material solution was then subjected to vacuum drying for 10 minutes at 50° C. to form a hole transport layer. The formed hole transport layer was further baked at 210° C. in a nitrogen atmosphere for 30 minutes to cross-link the hole transport material. The average film thickness of the formed hole transport layer was 20 nm.

Then, the green light emitting material (Lumation Green) manufactured by Sameishon K.K. was dissolved in a mixed solvent of xylene and mesitylene to prepare a material solution of the organic emitting layer. Then, the material solution of the organic emitting layer was applied to the area defined by the bank by the ink-jet method. The applied material solution was then subjected to vacuum drying for 10 minutes at 50° C. and then baked at 130° C. in a nitrogen atmosphere for 30 minutes. The average film thickness of the formed organic emitting layer was 70 nm.

Then, a barium film (manufactured by Aldrich, purity of 99% or more) with film thickness of 5 nm was formed on the organic emitting layer by the vacuum deposition method. And on the barium film, a film of a compound Alq (an aluminum quinolinol complex) mixed with barium of 20% (manufactured by Nippon Steel Chemical Co., Ltd., purity 99% or more) was formed by a co-deposition method. The film thickness of the compound Alq was 20 nm. And ITO with the film thickness of 100 nm was formed to prepare the transparent opposite electrode using the plasma coating device manufactured by Sumitomo Heavy Industries, Ltd. Finally, it was sealed with the glass sealant of the organic EL device in a nitrogen dry box in which concentration of water and oxygen is 5 ppm or less.

EXAMPLE 2

In Example 2, the organic EL device was manufactured similar to Example 1 except that the oxygen plasma method (plasma time was set to 120 second and power was set to 2000 W) was used in place of the UV-ozone treatment as the oxidation method of the surface of the pixel electrode.

EXAMPLE 3

In Example 3, the organic EL device was manufactured similar to Example 1 except that silver-palladium-copper-alloy (hereinafter also referred to as "APC") was used as the material of the pixel electrode and Lumation Red (Sameishon K.K.) was used as the material of the organic emitting layer.

COMPARATIVE EXAMPLE 1

In Comparative example 1, the organic EL device was manufactured similar to Example 1 except that the UV-ozone treatment was omitted.

COMPARATIVE EXAMPLE 2

In Comparative example 2, the organic EL device was manufactured similar to Example 1 except that APC was used as the material of the pixel electrode, UV-ozone treatment was omitted, PEDOT:PSS (manufactured by HC Stark Inc.) film was formed as the hole-injection layer on the pixel electrode after the substrate was washed, and Lumation Red (Sameishon K.K.) was used as the material of the organic emitting layer.

The PEDOT:PSS film was formed by applying the ink containing PEDOT:PSS to the area defined by the bank by an ink-jet method, drying the applied ink in a vacuum condition for 10 minutes at 50° C., and further baking in vacuum for 40 minutes at 200° C. The average film thickness of the formed hole-injection layer was 40 nm.

The driving voltage, the luminance efficiency, the life and the work function of the surface of the pixel electrode (or the surface of the hole-injection layer) of the organic EL device manufactured in Examples 1-3 and Comparative examples 1 and 2 were measured. The work function of the surface of the pixel electrode was determined with the photoelectron spectroscopy AC-2 manufactured by Riken Keiki. The driving voltage and the luminance efficiency of the organic EL device was determined at the current density of 10 mA/cm$^2$ by using the pixel electrode and the opposite electrode as an anode and a cathode, respectively. In addition, by emitting the device at the brightness of 4000 cd/m$^2$, and the attenuation of brightness was determined when driving was continued at a constant current and the time required until the brightness decreases by half (2000 cd/m$^2$) was defined as the life of the organic EL device. The measurement results are shown in Table 1.

TABLE 1

|  | Electrode Material | Surface Treatment | Organic Functional Layer | Work Function (eV) | Driving Voltage (V) | Luminance efficiency (cd/A) | Life (hour) |
| --- | --- | --- | --- | --- | --- | --- | --- |
| Example 1 | MoCr(97:3) | UV-O3 | HT/LGr | 5.6 | 7.2 | 5.0 | 560 |
| Example 2 | MoCr(97:3) | O2Plasma | HT/LGr | 5.6 | 7.4 | 5.1 | 530 |

TABLE 1-continued

|  | Electrode Material | Surface Treatment | Organic Functional Layer | Work Function (eV) | Driving Voltage (V) | Luminance efficiency (cd/A) | Life (hour) |
|---|---|---|---|---|---|---|---|
| Example 3 | APC | UV-O3 | HT/LRe | 5.6 | 9.4 | 9.3 |  |
| Comparative example 1 | MoCr(97:3) | washing alone | HT/LGr | 4.7 | 6.7 | 0.2 | <5 |
| Comparative example 2 | APC | washing alone | PEDOT/ HT/LRe | — | 9.6 | 7.6 |  |

As shown in Table 1, in the organic EL device of Examples 1 and 2, the work function of the surface of the oxidized pixel electrode (MoCr(97:3)) was 5.6 eV, and the work function of the surface of the oxidized pixel electrode (APC) of the organic EL device of Example 3 was 5.5 eV. These values were comparable with the work function (approximately 5.6 eV) of the surface of the hole-injection layer composed of molybdenum trioxide formed directly by sputtering (hereinafter referred to as "formed by conventional method") without subjecting to the oxidation treatment. On the other hand, the work function of the surface of the pixel electrode which was not subjected to oxidation treatment (Comparative example 2) was 4.7 eV.

As just described, the work function of the surface of the oxidized pixel electrode is comparable with the work function of the surface of the hole-injection layer composed of molybdenum trioxide formed by the conventional method. On the other hand, when it is not subjected to oxidation treatment, the work function of the surface of the pixel electrode is low. These results suggest that a hole injection function (high work function) can be provided at the surface of the pixel electrode by oxidizing the surface of the pixel electrode.

In addition, as shown in Table 1, the organic EL device of Example 1 showed the excellent driving voltage of 7.2V, the high luminance efficiency of 5.0 cd/A and the long life of 560 hours. The organic EL device of Example 2 showed almost comparable performance with the organic EL device of Example 1. The organic EL device of Example 3 showed higher driving voltage and luminance efficiency than those of the organic EL device of Examples 1 and 2.

On the other hand, the luminance efficiency of the organic EL device of the Comparative example 1 was as low as 0.2 cd/A and the life was extremely short as 5 hours or less. This is considered to be caused by disruption of the balance between holes and electrons in the device, because the work function of the surface of the pixel electrode is low and holes are not injected sufficiently to the organic emitting layer in the Comparative example 1 in which the surface of the pixel electrode is not subjected to the oxidization treatment.

In addition, the driving voltage of the organic EL device of the Comparative example 2 using PEDOT:PSS was comparable with the driving voltage of the organic EL device of Example 3. On the other hand, the luminance efficiency of the organic EL device of the Comparative example 2 is 7.6 cd/A, which is lower than the luminance efficiency (9.3 cd/A) of the organic EL device of Example 3. This is considered to be caused by the decrease of the light emitting efficiency due to the current leakage caused by the high conductivity of PEDOT:PSS.

These results suggest that by oxidizing the surface of the pixel electrode, a hole injection function can be provided on the surface of the pixel electrode without forming a hole-injection layer separately.

This application claims priority based on Japanese Patent Application 2008-254524 filed on Sep. 30, 2008. The contents described in the description of said application will be incorporated by reference in the description of the present application.

INDUSTRIAL APPLICABILITY

According to the manufacturing method of the organic EL device of the invention, an organic EL device having a hole-injection layer of excellent surface condition can be obtained. Therefore, it is possible to provide an organic EL device having the high luminance efficiency and lower power consumption.

In addition, according to the manufacturing method of the invention, patterning of the area in which the ink is applied and formation of the hole-injection layer can be conducted simultaneously. Therefore, the present invention provides a manufacturing method of the organic EL device with a simplified process.

EXPLANATION OF SYMBOLS

| | |
|---|---|
| 100, 200, 300 | organic EL device |
| 101 | substrate |
| 102, 102' | bank |
| 103, 103', 210 | pixel electrode |
| 104 | hole-injection layer |
| 105, 305 | liquid repellent organic film |
| 105' | lyophilic organic film |
| 107 | organic emitting layer |
| 109 | opposite electrode |
| 111 | mask |
| 204 | hole transport layer |
| 211 | underlayer |
| 213 | surface layer |

The invention claimed is:

1. An organic EL device comprising:
a substrate,
a pixel electrode arranged on the substrate, at least a part of a surface of the pixel electrode being oxidized,
a bank arranged on the substrate and covering a part or whole of an edge of the pixel electrode,
an organic functional layer arranged on the pixel electrode, and
a liquid repellent organic film arranged on the bank and defining an area of the organic functional layer, wherein the oxidized surface of the pixel electrode has a hole injection function, and an edge of the bank is aligned with an edge of the oxidized surface of the pixel electrode.

2. The organic EL device according to claim 1, wherein the liquid repellent organic film is not arranged on a portion of the bank surface, the portion lying at a periphery of the pixel electrode.

3. The organic EL device according to claim 1, wherein the bank is an insulating inorganic film.

4. The organic EL device according to claim 1, wherein the organic functional layer is also arranged on a portion of the bank surface, the portion lying at a periphery of the pixel electrode.

5. The organic EL device according to claim 1, wherein the pixel electrode comprises a metal layer and an oxide of a transition metal layer arranged on the metal layer.

6. The organic EL device according to claim 5, wherein the metal layer is a light reflecting metal layer.

7. The organic EL device according to claim 5, wherein the oxide of the transition metal is selected from silver oxide, molybdenum oxide, chromium oxide, vanadium oxide, tungsten oxide, nickel oxide, iridium oxide or an combination thereof.

8. The organic EL device according to claim 1, wherein the pixel electrode is an APC layer or a MoCr layer.

9. The organic EL device according to claim 1, wherein the liquid repellent organic film is a self-assembly-monolayer.

* * * * *